United States Patent
Lee

(10) Patent No.: US 6,604,220 B1
(45) Date of Patent: Aug. 5, 2003

(54) DISK DRIVE COMPRISING A MULTIPLE-INPUT SEQUENCE DETECTOR SELECTIVELY BIASED BY BITS OF A DECODED ECC CODEDWORD

(75) Inventor: Patrick J. Lee, San Jose, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 381 days.

(21) Appl. No.: 09/675,853

(22) Filed: Sep. 28, 2000

(51) Int. Cl.[7] .................. G11C 29/00; H03M 13/00; H03M 13/03

(52) U.S. Cl. .................. 714/769; 714/794; 714/755

(58) Field of Search .................. 714/769, 755, 714/794, 791, 795, 796; 375/290

(56) References Cited

U.S. PATENT DOCUMENTS

| | | | | |
|---|---|---|---|---|
| 5,420,893 A | * | 5/1995 | Ward .......................... | 375/368 |
| 5,721,745 A | * | 2/1998 | Hladik et al. .............. | 714/755 |
| 5,734,962 A | * | 3/1998 | Hladik et al. .............. | 455/12.1 |
| 5,761,248 A | * | 6/1998 | Hagenauer et al. ........ | 375/340 |
| 6,023,783 A | * | 2/2000 | Divsalar et al. ............ | 714/792 |
| 6,029,264 A | * | 2/2000 | Kobayashi et al. ......... | 714/755 |
| 6,134,697 A | * | 10/2000 | Jekal .......................... | 714/792 |
| 6,263,467 B1 | * | 7/2001 | Hladik et al. .............. | 714/755 |
| 6,304,995 B1 | * | 10/2001 | Smith et al. ................ | 714/786 |
| 6,392,572 B1 | * | 5/2002 | Shiu et al. .................. | 341/81 |
| 6,405,342 B1 | * | 6/2002 | Lee ............................. | 714/792 |
| 6,510,536 B1 | * | 1/2003 | Crozier et al. ............. | 714/755 |

FOREIGN PATENT DOCUMENTS

EP  1 009 098 A1  6/2000

OTHER PUBLICATIONS

Sawaguchi, H. and Wolf, J.K.; Turbo decoding for high–rate concatenated parity–check codes on PRML channels; This paper appears in IEEE Transactions on Magnetics Sep. 2000 On pp.: 2173–2175, vol.: 36; Presented at Intermag 2000 on Apr. 9, 2000–Apr. 13, 1920.*
D. Divsalar and F. Pollara; Hybrid Concatenated Codes and Iterative Decoding; NASA Code 315–91–20–20–53, Aug. 15, 1997.*
S. Benedetto, D. Divsalar, G. Montorsi, and F. Pollara; Soft–Output Decoding Algorithms in Iterative Decoding of Turbo Codes; NASA Code 315–91–20–20–53, Feb. 15, 1996.*
D. Divsalar and F. Pollara; On the Design of Turbo Codes; NASA Code 315–91–20–20–53, Nov. 15, 1995.*
Wicker, Stephen B. and Bhargava, Vijay K., "Read Solomon Codes and Their Applications", 1994, pp. 242–271, Chapter 11, Institute of Electrical Engineers, Inc., New York, NY.
Forney, G. David, Jr., "Generalized Minimum Distance Decoding", Apr. 1996, pp. 125–131, IEEE Trans. Info. Theory.
Hagenauer, Joachim and Hoeher, Peter, "A Viterbi Algorithm with Soft–Decision Outputs and its Applications", Nov. 1989, pp. 1680–1686, IEEE Globecom Conference, Dallas, TX.

* cited by examiner

Primary Examiner—Albert Decady
Assistant Examiner—Joseph D Torres
(74) Attorney, Agent, or Firm—Milad G. Shara, Esq.; Howard H. Sheerin, Esq.

(57) ABSTRACT

A disk drive is disclosed comprising a multiple-input sequence detector for detecting an estimated data sequence from a sequence of read signal sample values. The multiple-input sequence detector comprises a first iterative detector and a second iterative detector. An error correction code (ECC) decoder decodes the estimated data sequence into at least one decoded codeword comprising a plurality of bits which are used as reliability metrics for biasing at least one of the iterative detectors.

8 Claims, 6 Drawing Sheets

DISK DRIVE COMPRISING A MULTIPLE-INPUT SEQUENCE DETECTOR SELECTIVELY BIASED BY BITS OF A DECODED ECC CODEDWORD

BACKGROUND OF THE INVENTION

1. Field of the Invention

The present invention relates to disk drives for digital computers. More particularly, the present invention relates to a disk drive employing a multiple-input sequence detector comprising a first and second iterative detectors and an ECC decoder for decoding a first estimated data sequence detected by the multiple-input sequence detector into a decoded codeword concurrent with the multiple-input sequence detector detecting a second estimated data sequence, wherein the bits of the decoded codeword are used to assist the multiple-input sequence detector in detecting a third estimated data sequence.

2. Description of the Prior Art

It is well known that the bandwidth together with the signal-to-noise ratio (SNR) determines the capacity of a bandlimited communication system. This applies to disk storage systems for digital computers which are bandlimited in nature where "capacity" refers to the areal storage density of data recorded on a disk and thus refers to the storage capacity of the disk drive. Disk drive designers continually attempt to increase storage capacity by improving the materials and mechanics of the recording process, as well as by applying special signal processing and coding techniques in order to improve the effective SNR.

Modulation and error correction codes (ECC) are example coding schemes employed in disk drives which increase the effective SNR and thereby achieve an increase in storage capacity while still achieving some arbitrarily low bit error rate. Examples of modulation codes include a run length limited (RLL) code which limits the spacing between adjacent surface alterations on the disk in order to limit intersymbol interference (ISI), a distortion in the read signal caused by closely spaced, overlapping pulses. For example, in a system where a binary "1" bit modulates a surface alteration and a "0" bit modulates no surface alteration (i.e., NRZI recording), an RLL (d, k) code constrains the recorded data sequence such that at least d "0" bits occur between consecutive "1" bits, thereby ensuring that consecutive surface alterations are spread apart to limit ISI. Other examples of modulation codes include trellis codes, DC free codes, matched spectral null codes, maximum transition run codes, and other codes directed at increasing the effective SNR.

Modulation codes are typically augmented by ECC codes which further increase the effective SNR by encoding the user data into codewords that exhibit a minimum distance property measured relative to a Hamming distance. The Hamming distance defines the difference between valid codewords of the ECC code, and the minimum Hamming distance defines the correction power of the ECC code.

The extent that modulation and ECC codes increase the storage capacity of a disk drive is referred to as the "coding gain", which is normally measured as the SNR difference (in dB) between a system with coding and a system without coding that will achieve some arbitrarily low bit error rate. There is a limit, however, to the amount of gain that modulation and ECC codes can provide in a storage system because of the additional redundancy required to implement the code which decreases the user data density. This ratio of user data bits to codeword bits is referred to as the code rate; as the code rate decreases, the channel density must increase in order to maintain a desired user data density. Thus, there is a true coding gain only if the code rate is large enough to allow an increase in the user data density as compared to an uncoded system.

Other techniques have also been employed in disk drives in order to increase the effective SNR and increase storage capacity. As mentioned above, ISI typically causes the SNR in the read signal to decrease as the areal density increases. Various filtering techniques have been employed in the prior art to slim the pulses in order to reduce the undesirable degradation caused by ISI, but filtering the read signal tends to boost the high frequency noise. More recent disk drives employ special signal processing techniques referred to as partial response (PR) equalization with maximum likelihood (ML) sequence detection or PRML sequence detection which allows for a controlled amount of ISI rather than attempting to eradicate it through filtering. Since the effect of the controlled ISI in PRML systems is known, it can be taken into account in the sequence detection algorithm when demodulating the read signal into an estimated data sequence. This increases the effective SNR resulting in a corresponding increase in storage capacity; however, the extent that known PRML systems improve performance is limited.

There is, therefore, a need to increase the effective SNR in disk drives in order to achieve higher storage capacities while still achieving some arbitrarily low bit error rate. In particular, there is a need to improve upon known sequence detection techniques in order to improve the accuracy of the estimated data sequence detected during a read operation, thereby allowing for an increase in storage capacity without sacrificing performance in terms of bit error rate.

SUMMARY OF THE INVENTION

The present invention may be regarded as a disk drive employing an improved sequence detection technique during read operations. The disk drive comprises a disk for storing data, and a head for reading the data to generate an analog read signal. A sampler samples the analog read signal to generate a sequence of read signal sample values, and a multiple-input sequence detector detects an estimated data sequence from the read signal sample values during a read operation. The multiple-input sequence detector detects a first estimated data sequence during a first time interval, a second estimated data sequence during a second time interval, and a third estimated data sequence during, a third time interval. The multiple-input sequence detector comprises a first iterative detector, responsive to the read signal sample values and biased by selected reliability metrics, for generating first reliability metrics, and a second iterative detector, responsive to the read signal sample values and biased by the first reliability metrics, for generating second reliability metrics. An ECC decoder decodes the first estimated data sequence into at least one decoded codeword comprising a plurality of bits concurrent with the multiple-input sequence detector detecting the second estimated data sequence. A local memory stores the bits of the decoded codeword, and a means selects between the second reliability metrics and bits of the decoded codeword stored in the local memory as the selected reliability metrics for use in biasing the first iterative detector, whereby the bits of the decoded codeword assist the multiple-input sequence detector in detecting the third estimated data sequence.

The present invention may also be regarded as a method of improving a sequence detection operation in a disk drive.

Data stored on a disk is read to generate an analog read signal. The analog read signal is sampled to generate a sequence of read signal sample values, and an estimated data sequence is detected from the read signal sample values. The read signal sample values are processed to detect a first estimated data sequence during a first time interval, a second estimated data sequence during a second time interval, and a third estimated data sequence during a third time interval. The step of detecting the first, second, and third estimated data sequences comprises the steps of detecting first reliability metrics from the read signal sample values while biased by selected reliability metrics, and detecting second reliability metrics from the read signal sample values while biased by first reliability metrics. The first estimated data sequence is decoded by an ECC decoder into at least one decoded codeword comprising a plurality of bits which are stored in a local memory. A selection is made between the second reliability metrics and bits of the decoded codeword stored in the local memory as the selected reliability metrics for use in biasing the detecting of the first reliability metrics, whereby the bits of the decoded codeword assist in detecting the third estimated data sequence

DESCRIPTION OF THE PREFERRED EMBODIMENTS

System Overview

Figure 1:
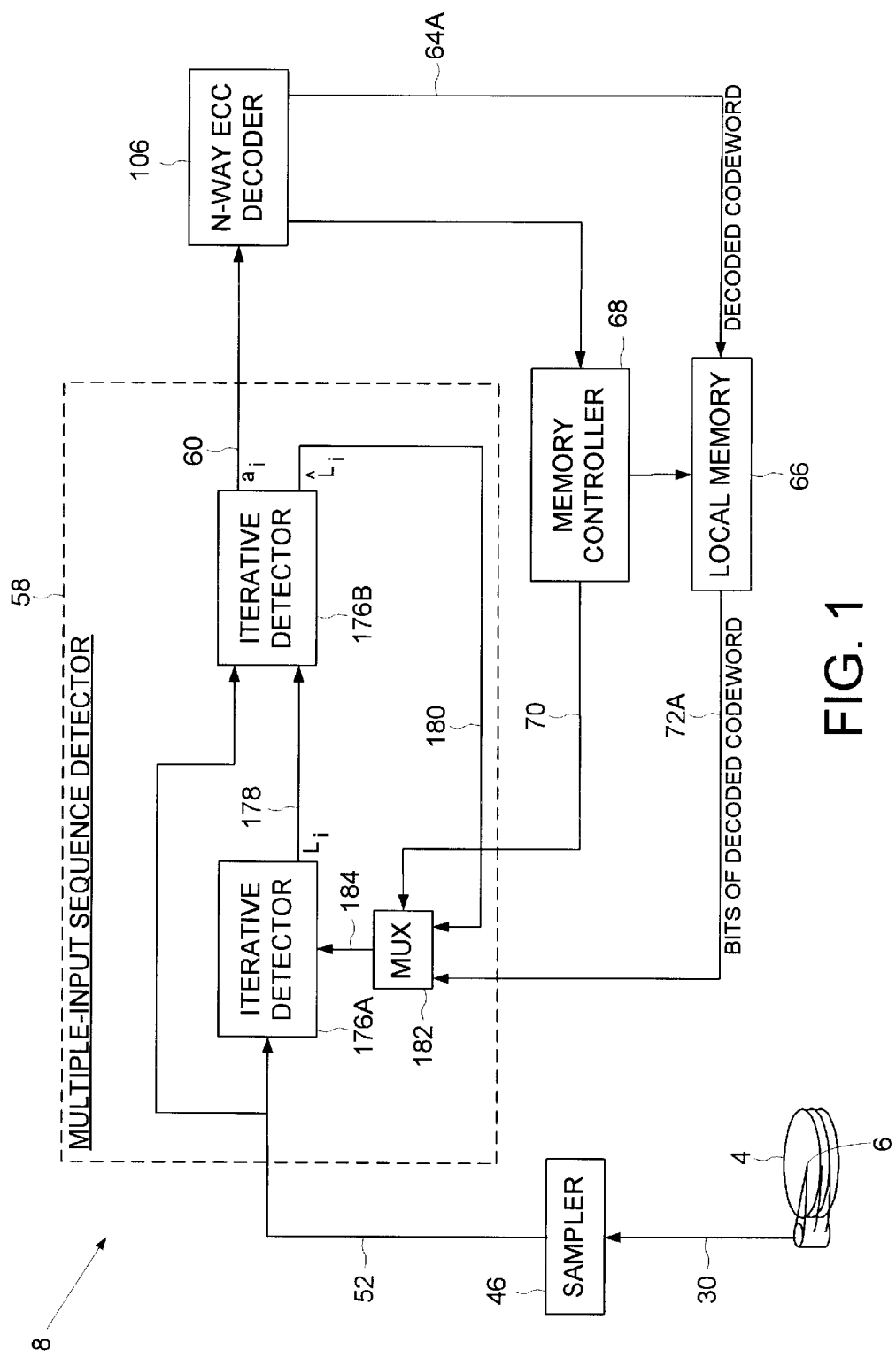
FIG. 1 shows a disk drive according to an embodiment of the present invention comprising a multiple-input sequence detector for generating estimated data sequences in iterative passes and an N-way ECC decoder for concurrently decoding the estimated data sequences into decoded codewords which are fed back as reliability metrics to the multiple-input sequence detector.

Referring to FIG. 1, shown is a disk drive 8 according to an embodiment of the present invention. The disk drive comprises a disk 4 for storing data, a read head 6 for reading the data stored on the disk 4 to generate an analog read signal 30, and a sampler 46 for sampling the analog read signal 30 to generate a sequence of read signal sample values 52. A multiple-input sequence detector 58, responsive to the read signal sample values 52, detects a first estimated data sequence $a_1$ output on line 60 during a first time interval, a second estimated data sequence $a_2$ output on line 60 during a second time interval, and a third estimated data sequence $a_3$ output on line 60 during a third time interval. The multiple-input sequence detector 58 comprises a first iterative detector 176A, responsive to the read signal sample values 52 and biased by selected reliability metrics 184, for generating first reliability metrics $L_i$ 178, and a second iterative detector 176B, responsive to the read signal sample values 52 and biased by the first reliability metrics $L_i$ 178, for generating second reliability metrics $\hat{L}_i$ 180. An ECC decoder decodes the first estimated data sequence $a_1$ into a decoded codeword 64A comprising a plurality of bits concurrent with the multiple-input sequence detector 58 detecting the second estimated data sequence $a_2$. A local memory 66 stores the bits of the decoded codeword 64A, and a means, such as a multiplexer 182 and a memory controller 68, selects between the second reliability metrics 180 and bits of the decoded codeword 72A stored in the local memory 66 as the selected reliability metrics 184 for use in biasing the first iterative detector 176A, whereby the bits of the decoded codeword 72A assist the multiple-input sequence detector 58 in detecting the third estimated data sequence $a_3$.

Iterative detectors, such as the iterative detectors 176A and 176B shown in FIG. 1, pass reliability metrics between one another in iterative passes. After each pass, the reliability metrics are updated toward a higher reliability until the output of one of the iterative detectors is deemed reliable enough for ECC decoding. Each iterative detector attempts to maximize the log-likelihood ratio of an estimated data sequence through a trellis given a sequence of read signal samples. As part of the detection algorithm, the iterative detector computes an extrinsic log-likelihood value which is used as a reliability metric during the next iteration by the companion iterative detector. A predetermined number of redundancy symbols are encoded into the recorded data such that the reliability metrics passed between the iterative decoders are independent estimates of the log-likelihood ratio for the estimated data sequence. Typical iterative detectors employ a suitable interleaver between a first and second encoder during a write operation, and a suitable deinterleaver/reinterleaver between the first and second iterative detectors during a read operation as is well known in the art. An overview of the operation and implementation of iterative detectors is provided by Hagenauer, Offer and Papke, "Iterative Decoding of Binary Block and Convolutional Codes", *IEEE Transactions on Information Theory*, Vol. 42, No. 2, March 1996, and by C. Berrou, A. Glavieux, and P. Thitimasjshima, "Near Shannon Limit Error-Correcting Coding and Decoding: Turbo-Codes(1),"*Proc., IEEE Int. Conf. on Comm.*, (Geneva, Switzerland), pp. 1064–1070, May 1993, the disclosures of which are herein incorporated by reference.

Figure 2:
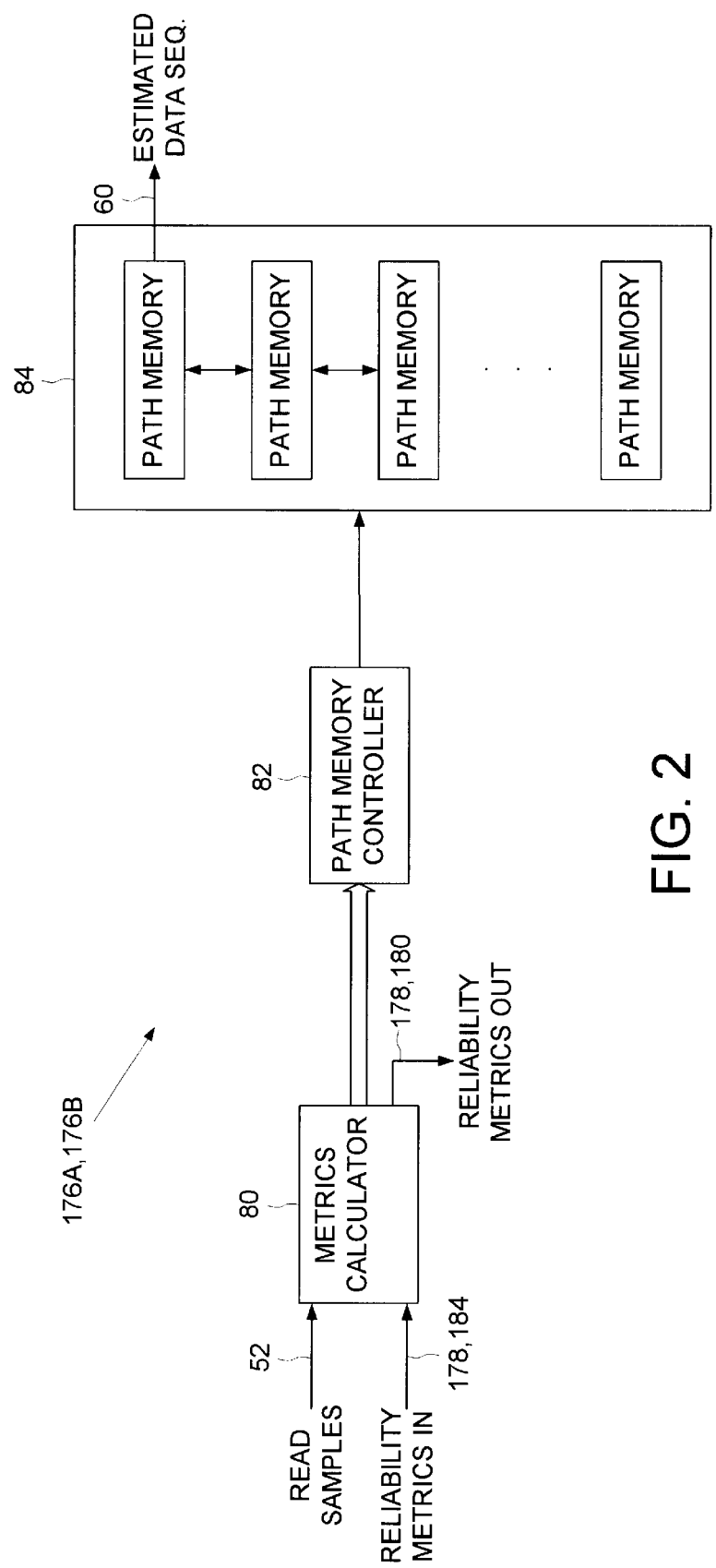
FIG. 2 is an overview of the multiple-input sequence detector of FIG. 1 comprising a metrics calculator for computing state metrics from the read signal sample values and the reliability metrics during a read operation.

FIG. 2 shows the components of a suitable iterative detector (176A, 176B) for use in FIG. 1 comprising a metrics calculator 80, a path memory controller 82, and path memory 84. The metrics calculator 80 processes the read signal sample values 52 during a read operation to compute state metrics relative to the read signal sample values and expected sample values of valid output sequences. The metrics calculator 80 also uses reliability metrics (178, 184) to bias the computing of the state metrics, and in turn outputs reliability metrics (178, 180) for use by the companion iterative detector. The path memory controller 82 responds to the state metrics by updating the path memories 84 which store estimated data sequences referred to as survivor sequences. Eventually, the survivor sequences will merger into a single survivor sequence which becomes the estimated data sequence 60 output by the multiple-input sequence detector 58.

During an initial read operation the first iterative detector 176A processes the read signal samples 52 to generate an estimated data sequence in the form of a first sequence of reliability metrics $L_i$ 178. The second iterative detector 176B processes the read signal sample values 52 together with the first sequence of reliability metrics $L_i$ 178 to generate a second sequence of reliability metrics $\hat{L}_i$ 180. After the second iterative detector 176B is finished processing the read signal sample values 52, the first iterative detector 176A again processes the read signal sample values 52 together with the reliability metrics 184 selected from the second sequence of reliability metrics $\hat{L}_i$ 180 or the bits of a decoded codeword 72A to regenerate the first sequence of reliability metrics $L_i$ 178 which typically would have a higher degree of reliability than that generated during the first pass. The second iterative detector 176B again processes the read signal sample values 52 together with the first sequence of reliability metrics $L_i$ 178 to generate the second sequence of reliability metrics $\hat{L}_i$ 180 having a still higher reliability.

The estimated data sequence 60 output by the multiple-input sequence detector 58 is processed by an N-way ECC decoder which attempts to decode at least one of a plurality of interleaved ECC codewords encoded into the recorded data sequence. The decoded codeword(s) 64A are stored in a local memory and used to bias the computing of the state metrics in at least one of the iterative detectors (iterative detector 176A in FIG. 1) during a subsequent pass over the read signal sample values 52. When available, the bits of the decoded codeword 72A are multiplexed 182 into the iterative detector 176A since the bit of a decoded ECC codeword is typically much more reliable than the "soft" reliability metric 180 generated by the companion iterative detector 176B. In an alternative embodiment, the bits of the decoded codeword 72A could be used to modify the operation of the second iterative sequence detector 176B, which could be made in place of, or in addition to, modifying the operation of the first iterative sequence detector 176A. The bits of the decoded codeword 72A improve the performance of the multiple-input sequence detector 58, thereby providing an increase in the effective SNR and a corresponding increase in the disk drive's storage capacity.

N-Way Interleaved ECC Reliability Metrics

Figure 3:
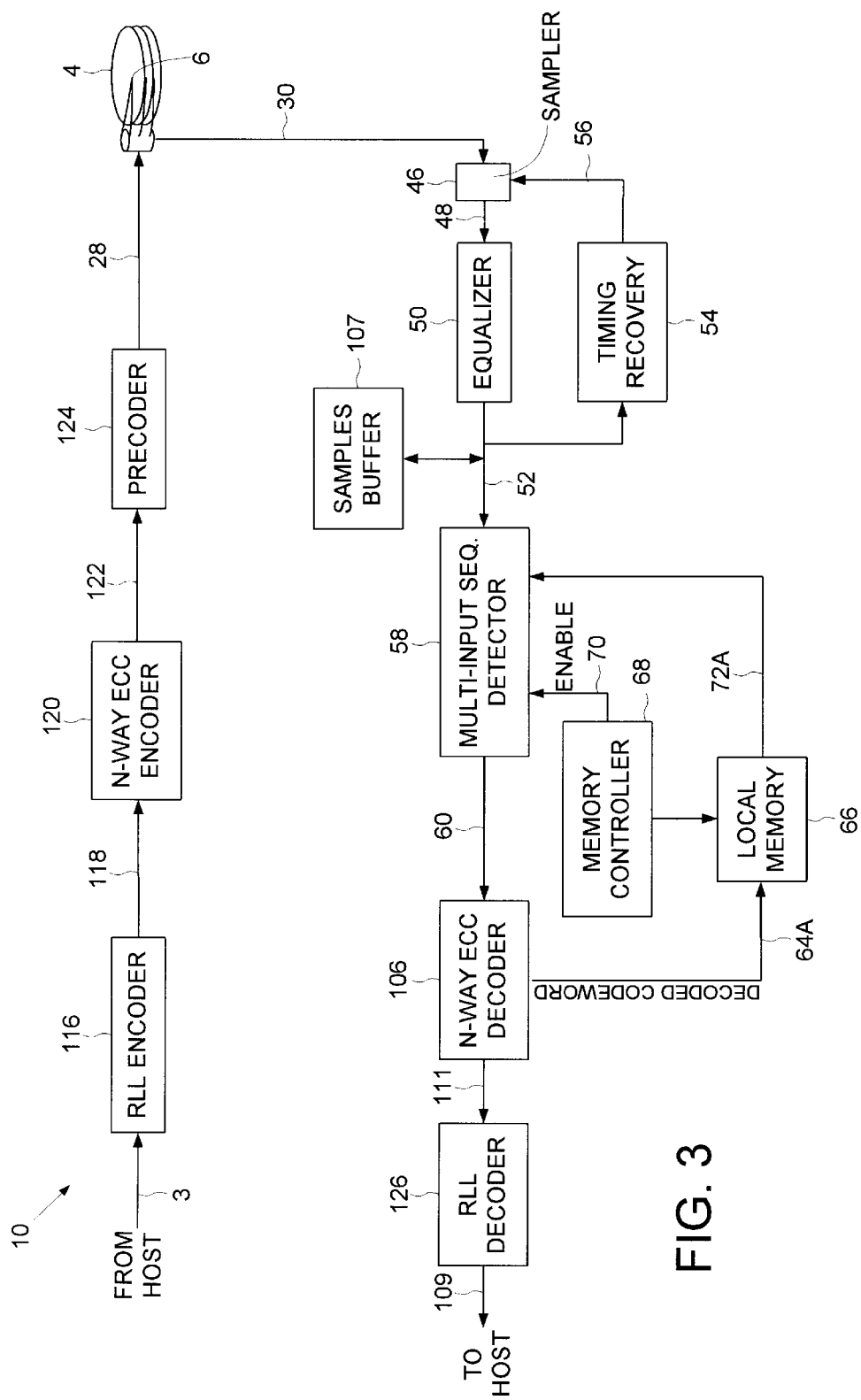
FIG. 3 illustrates a disk drive according to an embodiment of the present invention employing a multiple interleaved ECC system illustrated in FIG. 4A–4C.

Referring to FIG. 3, shown is a suitable disk drive 10 according to one embodiment of the present invention. In addition to the elements shown in FIG. 1, the disk drive 10 of FIG. 3 includes an RLL encoder 116, an N-way ECC encoder 120, a precoder 124, an RLL decoder 126, and a samples buffer 107. The samples buffer 107 stores the read signal sample values 52 so that the iterative detectors 176A and 176B within the multiple-input sequence detector 58 can perform iterative passes over the read signal sample values 52 without having to reread the data from the disk 4.

The disk drive of FIG. 3 also comprises an equalizer 50 and a timing recovery circuit 54 which are typically found in disk drives implementing PRML sequence detection. The equalizer 50 is suitably implemented as a finite-impulse-response (FIR) filter comprising a sufficient number of coefficients to adequately shape the read signal sample values 48 toward a suitable PR target (e.g., PR4, EPR4 or EEPR4 target). The timing recovery circuit 54 processes the read signal sample values 52 output by the equalizer 50 to extract timing information from the read signal; the timing information is used to synchronize the sampler 46 so that it samples the analog read signal 30 synchronous to the baud rate. For example, the timing recovery circuit 54 may generate a phase error between the equalized read signal sample values 52 and expected sample values corresponding to the PR target. The sampler 46 suitably comprises a variable frequency oscillator (VFO) responsive to the phase error for generating a sampling clock 56 synchronized to the baud rate; the sampling clock 56 in turn controls the sampler 46 such that it samples the analog read signal 30 synchronous to the baud rate. An alternative embodiment for timing recovery is to sample the analog read signal 30 asynchronous to the baud rate and then interpolate the asynchronous sample values to generate read signal sample values synchronized to the baud rate. In this embodiment, the phase error is used to generate an interpolation interval between the read signal sample values and the expected sample values of the PR target. An interpolation filter interpolates the asynchronous samples in response to the interpolation interval to generate read signal sample values synchronized to the baud rate.

The user data 3 received from the host is preferably first encoded according to a modulation code, such as an RLL code, and then encoded according to an ECC code, such as the well known Reed-Solomon code. The reason the modulation code (RLL code) is preferably the outer code is to avoid the error propagation that would otherwise occur if the modulation code were the inner code. A suitable RLL encoder 116 encodes the user data 3 received from the host to generate channel data 118 which is then encoded according to the ECC code by a suitable N-way ECC encoder 120, such as a Reed-Solomon encoder, to generate interleaved ECC codewords. Because the ECC code is the inner code, the redundancy symbols generated in ECC encoding the channel data 118 must also be encoded according to the modulation code constraints. Thus, the N-way ECC encoder 120 of FIG. 3 comprises a suitable modulation code encoder (RLL encoder) for encoding the ECC redundancy symbols according to the modulation code constraint (RLL constraint). The ECC encoded data 122 is then precoded by a suitable precoder 124 which compensates for the transfer function of the PR read channel in order to facilitate encoding the modulation code constraints. A suitable precoder for a PR4 read channel, for example, is a $1/(1+D^2)$ filter where the "+" is an exclusive-or operator. The write data 28 output by the precoder 124 modulates the current in the write coil of the head 6 in order to record the write data 28 to the disk 4.

During an initial read operation when attempting to read a data block (data sector) from the disk 4, the read signal 30 emanating from the head is sampled by sampler 46, the read signal samples 48 filtered by equalizer 50 according to the desired PR target, and the sampler 46 synchronized by the timing recovery circuit 54 as described above. The read signal samples 52 at the output of the equalizer 50 are processed by the multiple-input sequence detector 58 which detects the estimated data sequence 60 processed by the N-way ECC decoder 106. The N-way ECC decoder 106 comprises a suitable modulation decoder (e.g., RLL decoder) for decoding the redundancy symbols for each of the interleaved ECC codewords. The interleaved ECC codewords are then divided by the factors of a generator polynomial, as is well known in the art, for generating error syndromes used to detect and correct errors in the codewords, thereby generating decoded codewords 64A.

When the N-way ECC decoder 106 determines that one or more of the interleaved ECC codewords is uncorrectable, it transfers the decoded codeword(s) 64A (if any) to the local memory 66. During subsequent passes over the read signal samples 52 stored in the samples buffer 107, the buffer controller 68 generates the enable signal 70 at the appropriate times and concurrently applies the bits of the decoded codeword(s) 72A stored in the local memory 66 to the multiple-input sequence detector 58 in order to bias the computing of the state metrics. Once the data block (data sector) is successfully decoded by the N-way ECC decoder 106, it is decoded by a suitable modulation decoder (e.g., RLL decoder 126) and the decoded user data 109 is transferred to the host.

Errors typically occur in disk drives due to defects in the disk which result in burst errors that affect a long number of consecutive symbols. Thus, the disk drive 10 of FIG. 3 increases the efficiency of the ECC code by interleaving the symbols of a data sector to form multiple interleaved ECC codewords. In this manner when a burst error is encountered, the error is spread across the multiple codewords such that the correction power and circuitry needed to correct the error in each interleaved ECC codeword is less than that needed to correct the burst error occurring in a single codeword. For example, if a data sector comprises three interleaved ECC codewords and a burst error corrupts three consecutive symbols, then the burst error will corrupt one symbol in each codeword rather than corrupting three symbols in one codeword. Thus, the cost and complexity of the disk drive is reduced since less circuitry is required to correct fewer errors in each codeword, and since the circuitry for decoding each codeword can be shared.

The accurate decoding of a data sector requires the successful decoding of each interleaved ECC codeword, which is dependent upon the accuracy of the estimated data sequence 60 output by the multiple-input sequence detector 58. The present invention enhances the multiple-input sequence detector 58 by recognizing that when one or more of the interleaved ECC codewords is successfully decoded, the bits of the decoded codeword(s) 72A can be used to guide the multiple-input sequence detector 58 through the trellis during the time indices corresponding to the known bit values in the decoded codeword. This significantly improves the accuracy of the multiple-input sequence detector 58 by correcting errors in the uncorrectable interleaves of the previously uncorrectable ECC codewords.

Figure 4A:
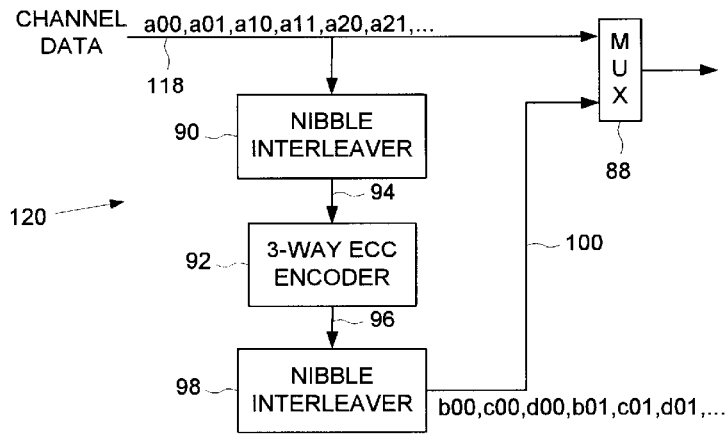
FIG. 4A is a block diagram of the ECC encoder shown in FIG. 3 comprising a 3-way interleaver for generating a block of data comprising 3-interleaved ECC codewords written to the disk.
Figure 4B:
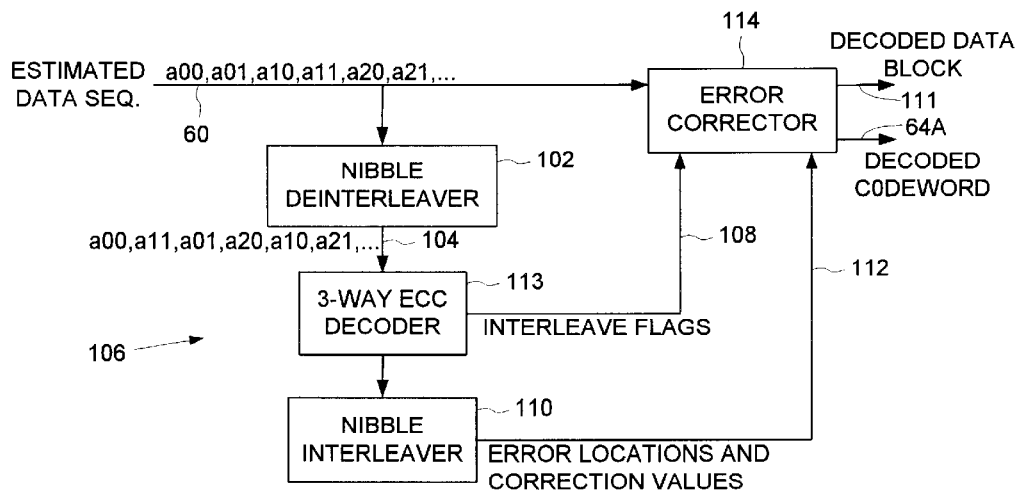
FIG. 4B illustrates the 3-way deinterleaving, ECC decoding, and interleaving steps involved with decoding the 3-interleaved ECC codewords during a read operation.
Figure 4C:
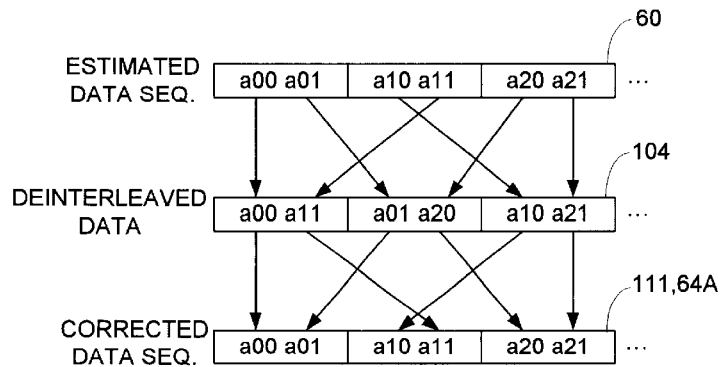
FIG. 4C further illustrates the 3-way deinterleaving and decoding operations of the ECC decoder of FIG. 4B.

FIGS. 4A, 4B, and 4C illustrate an example embodiment of a suitable interleaved ECC system for use in the present invention. In this embodiment, a suitable block ECC code, such as the well-known Reed-Solomon ECC code, is used to encode the user data into three interleaved ECC codewords. Preferably, the ECC codewords comprise a predetermined number of 8-bit data symbols followed by a predetermined number of 8-bit redundancy symbols. In a typical 512 byte data sector employed in disk drives, for example, two of the interleaved ECC codewords comprise 171 data bytes while the other interleaved ECC codeword comprises 170 data bytes. A predetermined number of redundancy bytes are appended to each of the interleaved ECC codewords, where the number of redundancy bytes determines the error correction capability of the ECC code. In order to further enhance the performance gain realized by using the bits of a decoded codeword 72A for modifying the operation of the multiple-input sequence detector 58 during retry operations, the data is first interleaved on nibble boundaries before it is byte interleaved into the interleaved ECC codewords. In this manner, the bits of a decoded codeword(s) are spread more intermittently through the trellis which improves performance.

Referring now to FIG. 4A which is a block diagram of the N-way ECC encoder 120 of FIG. 3, the channel data 118 to be encoded is transmitted to a multiplexer 88 and to a nibble interleaver 90. The sequence a00,a01,a10,11,a20,a21, . . .

denotes consecutive nibbles in the channel data 118, that is, a00 represents nibble 0 in byte 0, a01 represents nibble 1 in byte 0, a10 represents nibble 0 in byte 1, etc. The nibble interleaver 90 performs a 3-way interleave on the nibble boundaries of the channel data 118 such that the output of the nibble interleaver 90 is a00,a11,a01,a20,a10,a21, . . .

The output of the nibble interleaver 90 is then encoded using a 3-way ECC encoder 92 which encodes the nibble interleaved data sequence 94 into three interleaved ECC codewords, where the interleaving performed by the 3-way ECC encoder 92 is on the byte boundaries of the data sequence 94. The 3-way ECC encoder 92 produces redundancy bytes 96 for three interleaved ECC codewords (b,c,d) preferably by dividing each interleave of the channel data 118 represented as a polynomial by a generator polynomial using well known techniques. The resulting sequence of redundancy bytes 96 is represented as b00,b01,c00,c01,d00,d01,b10,b11, . . .

where b00, b01 represent the first and second nibble of the first redundancy byte of the first interleaved ECC codeword, c00, c01 represent the first and second nibble of the second redundancy byte of the second interleaved ECC codeword, and so on. The redundancy symbols 96 are then interleaved by nibble interleaver 98 which interleaves the nibbles of the redundancy bytes 96 to produce an interleaved sequence of redundancy nibbles 100 of the form b00,c00,d00,b01,c01,d01, . . .

which facilitates the decoding operation during read back. As the redundancy bytes are generated for the channel data 118, the channel data 118 are passed through multiplexer 88 and written to the disk 4. The interleaved sequence of redundancy nibbles 100 are then passed through the multiplexer 88 and written to the disk 4 to complete the write operation for the current data sector.

An overview of the N-way ECC decoder 106 of FIG. 3 for decoding a data sector during read back is shown in FIG. 4B. The estimated data sequence 60 output by the multiple-input sequence detector 58 of FIG. 3 is input into a nibble deinterleaver 102 which performs the same function as nibble interleaver 90 of FIG. 4A in order to deinterleave the estimated data sequence 60 into its constituent interleaved ECC codewords. The three ECC codewords in the deinterleaved data sequence 104 are then decoded by a suitable 3-way ECC decoder 113, such as the well-known Reed-Solomon ECC decoder. A Reed-Solomon decoder operates by dividing the received codeword polynomial by factors of the generator polynomial to generate error syndromes. Non-zero error syndromes indicate that errors exist in the received codeword in which case the error syndromes are further processed to compute the error locations and correction value. If the number of errors in a particular interleaved ECC codeword exceeds the error correction capability of the ECC code, then the codeword is deemed uncorrectable. The ECC decoder generates interleave flags 108 to indicate which interleaved ECC codewords are uncorrectable. If one or more of the interleaved ECC codewords are correctable, then a nibble interleaver 110 interleaves the error locations to correspond to the interleaved estimated data sequence 60, and transmits the error locations and correction values 112 to an error corrector 114. The error corrector 114 process the error locations and correction values 112 to make the appropriate corrections to the estimated data sequence 60. If all three interleaved ECC codewords are correctable, then the error corrector 114 transmits the corrected data block 111 to the RLL decoder 126. If one or more of the interleaved ECC codewords are correctable (decodable) but one or more are uncorrectable, as indicated by the interleave flags 108, then the bits of the decoded codeword(s) 64A are used as hard reliability metrics input into the multiple-input sequence detector 58.

The nibble deinterleaving, decoding and interleaving operations performed during read back is further understand with reference to FIG. 4C. The estimated data sequence 60 is first deinterleaved on the nibble boundaries to generate a deinterleaved data sequence 104 in order to deinterleave the estimated data sequence 60 into its three constituent codewords. The codewords are then decoded by the 3-way ECC decoder 113, and the error locations and correction values are reinterleaved in order to correct the estimated data sequence 60 to thereby form a corrected data sequence which is either the decoded data block 111 if all of the interleaved ECC codewords are successfully decoded, or the bits of a decoded codeword 64A for use in modifying the multiple-input sequence detector 58. Note that the decoded codeword 64A in FIG. 4C corresponds to the estimated data sequence 60 detected by the multiple-input sequence detector 58. This facilitates applying the bits of the decoded codeword 72A to the metrics calculator 80 of FIG. 2 at the appropriate times in order to correctly bias the computing of the state metrics.

Concurrent Decoding Operation

Figure 5:
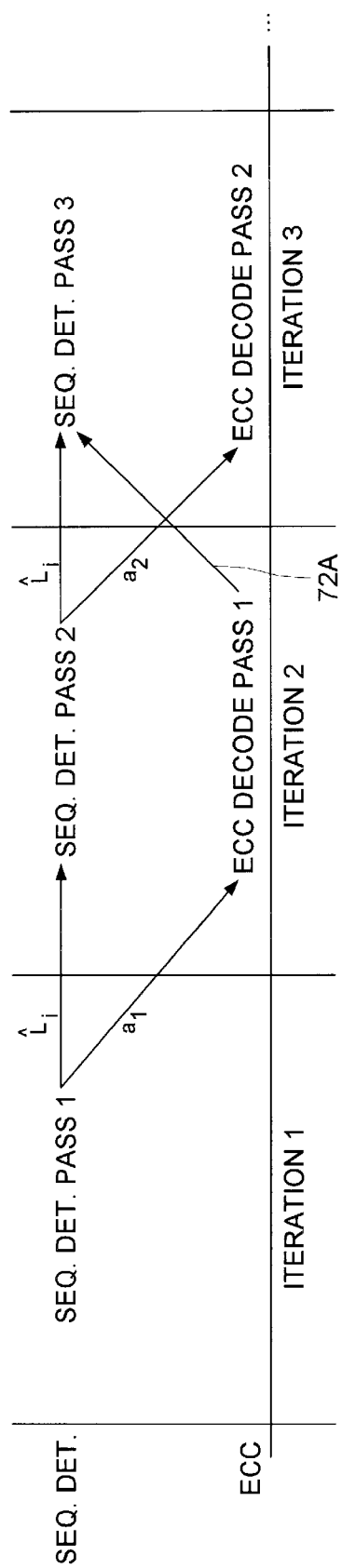
FIG. 5 is a timing diagram illustrating the concurrent sequence detection and ECC decoding operations.

In order to minimize the latency of the disk drive, the N-way ECC decoder 106 of FIG. 1 operates concurrently with the multiple-input sequence detector 58 detecting an updated estimated data sequence $a_i$ output on line 60. This process is illustrated with reference to FIG. 5 which shows a timeline and the concurrent, overlapping operations of the multiple-input sequence detector 58 and N-way ECC decoder 106.

During a first iteration (ITERATION 1), the multiple-input sequence detector 58 processes the read signal sample values 52 to detect a first estimated data sequence $a_1$ which is output on line 60 to the N-way ECC decoder 106. During the next iteration (ITERATION 2), the multiple-input sequence detector 58 processes the read signal samples 52 and the reliability metrics ^$L_i$ 180 generated by the second iterative detector 176B to detect a second estimated data sequence $a_2$ output on line 60 concurrent with the N-way ECC decoder 106 attempting to decode the first estimated data sequence $a_1$ into at least one decoded codeword 72A (i.e., decode at least one of the interleaved codewords). If the ECC decoder 106 successfully decodes at least one of the interleaved codewords, then the bits of the decoded codeword(s) 72A are input into the multiple-input sequence detector 58 for use during the third iteration (ITERATION 3) where they are used to bias the computing of the state metrics while detecting a third estimated data sequence $a_3$ output on line 60. Also during the third iteration, the ECC decoder 106 concurrently processes the second estimated data sequence $a_2$ in an attempt to decode the previously uncorrectable interleaved codewords.

This process reiterates until the N-way ECC decoder 106 successfully decodes all of the interleaved codewords in the estimated data sequence $a_2$. Because the bits of a decoded codeword(s) 72A provide more reliable information than the soft reliability metrics ^$L_i$ 180 generated by the iterative detector 176B, the accuracy of the multiple-input sequence detector increases, thereby increasing the effective SNR and thus the overall storage capacity of the disk drive.

Turbo Code Sequence Detector

Figure 6:
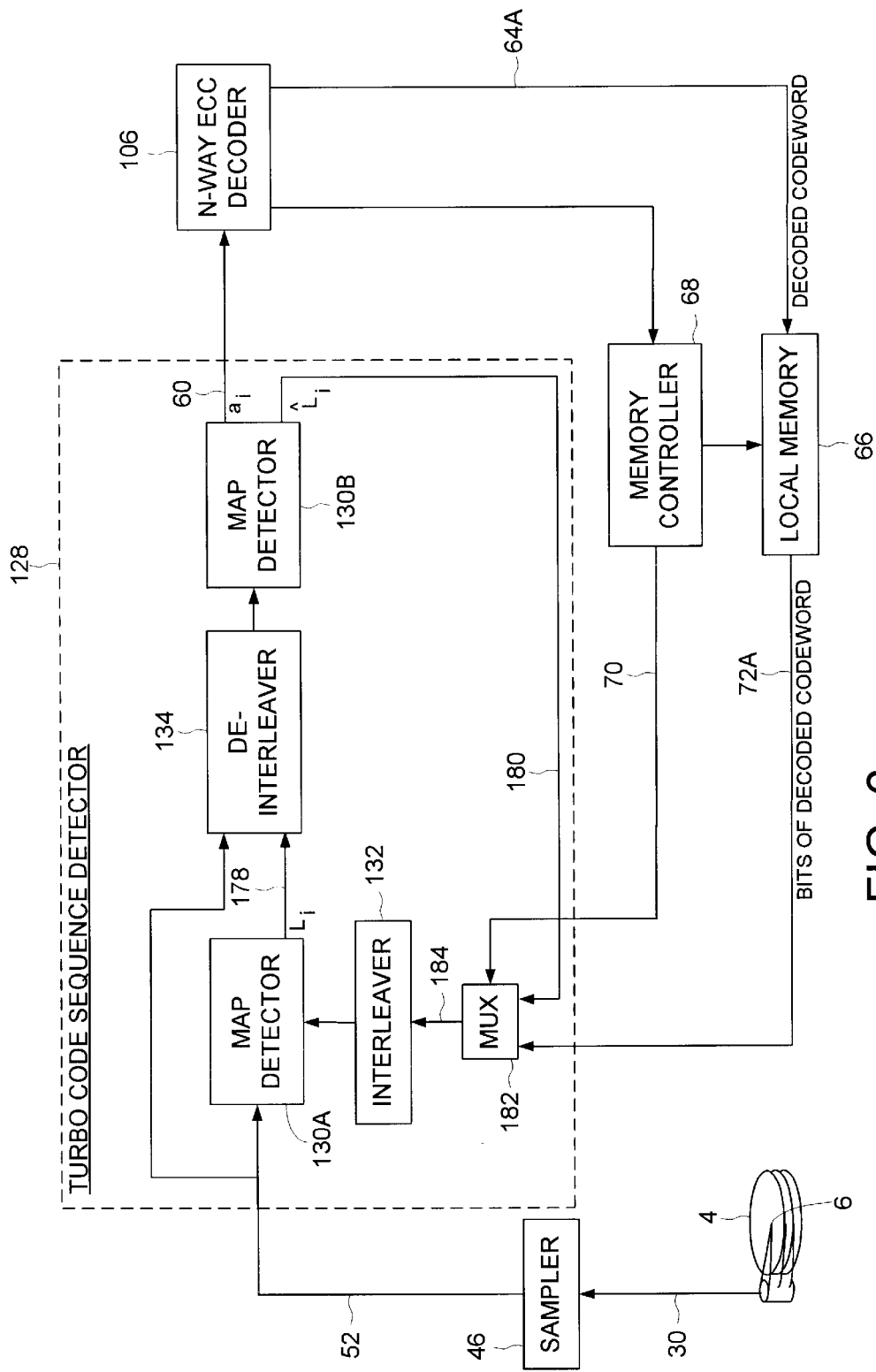
FIG. 6 shows a disk drive according to an embodiment of the present invention wherein the multiple-input sequence detector is implemented as a turbo code sequence detector comprising a first and second MAP detectors and suitable interleaver/de-interleaver.

FIG. 6 shows an embodiment of the present invention wherein the multi-input sequence detector 58 of FIG. 1 comprises a turbo code sequence detector 128. In one embodiment, a turbo code encoder consists of concatenated recursive systematic convolutional codes separated by a pseudo-random interleaver and followed by puncturing. The iterative detectors 176A and 176B of FIG. 1 are implemented as maximum a posteriori (MAP) detectors 130A and 130B which decode the two convolutional codes, respectively. The MAP detectors 130A and 1130B iteratively share reliability metrics 178 and 180, and MAP detector 130A is biased by the bits of a decoded codeword 72A if available. The turbo code sequence detector 128 comprises an interleaver 132 and a de-interleaver 134 which account for the psuedo-random interleaver of the turbo code encoder.

I claim:

1. A disk drive comprising:
   (a) a disk for storing data;
   (b) a head for reading the data stored on the disk to generate an analog read signal;
   (c) a sampler for sampling the analog read signal to generate a sequence of read signal sample values;
   (d) a multiple-input sequence detector, responsive to the read signal sample values, for detecting a first estimated data sequence during a first time interval, a second estimated data sequence during a second time interval, and a third estimated data sequence during a third time interval, the multiple-input sequence detector comprising:
      i. a first iterative detector, responsive to the read signal sample values and biased by selected reliability metrics, for generating first reliability metrics; and
      ii. a second iterative detector, responsive to the read signal sample values and biased by the first reliability metrics, for generating second reliability metrics;
   (e) an ECC decoder for decoding the first estimated data sequence into at least one decoded codeword comprising a plurality of bits concurrent with the multiple-input sequence detector detecting the second estimated data sequence;
   (f) a local memory for storing bits of the decoded codeword; and
   (g) a means for selecting between the second reliability metrics and bits of the decoded codeword stored in the local memory as the selected reliability metrics for use in biasing the first iterative detector, whereby the bits of the decoded codeword assist the multiple-input sequence detector in detecting the third estimated data sequence.

2. The disk drive as recited in claim 1, wherein:
   (a) the first iterative detector comprises a metrics calculator for computing state metrics relative to the read signal sample values and expected sample values of valid output sequences; and
   (b) the computing of the state metrics is biased by the selected reliability metrics.

3. The disk drive as recited in claim 1, wherein the first estimated data sequence comprises at least two interleaved error correction code codewords.

4. The disk drive as recited in claim 3, wherein the error correction code codewords are nibble interleaved.

5. A method of improving a sequence detection operation in a disk drive during a read operation, comprising the steps of:

(a) reading a data stored on a disk to generate an analog read signal;

(b) sampling the analog read signal to generate a sequence of read signal sample values;

(c) processing the read signal sample values to detect a first estimated data sequence during a first time interval, a second estimated data sequence during a second time interval, and a third estimated data sequence during a third time interval, comprising the steps of:

i. detecting first reliability metrics from the read signal sample values while biased by selected reliability metrics; and ii. detecting second reliability metrics from the read signal sample values while biased by first reliability metrics;

(d) decoding the first estimated data sequence into at least one decoded codeword comprising a plurality of bits concurrent with detecting the second estimated data sequence;

(e) storing bits of the decoded codeword in a local memory; and (f) selecting between the second reliability metrics and bits of the decoded codeword stored in the local memory as the selected reliability metrics for use in biasing the detecting of the first reliability metrics, whereby the bits of the decoded codeword assist in detecting the third estimated data sequence.

6. The method as recited in claim 5, wherein:

(a) the step of detecting first reliability metrics from the read signal sample values comprises the step of computing state metrics relative to the read signal sample values and expected sample values of valid output sequences; and (b) the computing of the state metrics is biased by the selected reliability metrics.

7. The method as recited in claim 5, wherein the first estimated data sequence comprises at least two interleaved error correction code codewords.

8. The method as recited in claim 7, wherein the error correction code codewords are nibble interleaved.

* * * * *